United States Patent
Kaguchi et al.

(10) Patent No.: US 9,627,383 B2
(45) Date of Patent: Apr. 18, 2017

(54) SEMICONDUCTOR DEVICE

(71) Applicant: Mitsubishi Electric Corporation, Tokyo (JP)

(72) Inventors: Naoto Kaguchi, Tokyo (JP); Eisuke Suekawa, Tokyo (JP); Masaaki Ikegami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/906,588

(22) PCT Filed: Sep. 17, 2013

(86) PCT No.: PCT/JP2013/074964
§ 371 (c)(1),
(2) Date: Jan. 21, 2016

(87) PCT Pub. No.: WO2015/040662
PCT Pub. Date: Mar. 26, 2015

(65) Prior Publication Data
US 2016/0163703 A1 Jun. 9, 2016

(51) Int. Cl.
*H01L 29/16* (2006.01)
*H01L 27/092* (2006.01)
(Continued)

(52) U.S. Cl.
CPC ...... *H01L 27/0922* (2013.01); *H01L 21/8213* (2013.01); *H01L 27/0207* (2013.01);
(Continued)

(58) Field of Classification Search
CPC ............. H01L 29/7802; H01L 29/7816; H01L 29/1608; H03K 17/6871
See application file for complete search history.

(56) References Cited

U.S. PATENT DOCUMENTS

| | | | |
|---|---|---|---|
| 6,580,121 B2 | 6/2003 | Hisamoto | |
| 7,695,997 B2 | 4/2010 | Shimoida et al. | |
| 2006/0113593 A1* | 6/2006 | Sankin | H01L 27/098 257/341 |

FOREIGN PATENT DOCUMENTS

| | | |
|---|---|---|
| JP | 6-244413 A | 9/1994 |
| JP | 2000-223705 A | 8/2000 |

(Continued)

OTHER PUBLICATIONS

Written opinion in PCT/JP2013/074964, downloaded Dec. 17, 2016.*
International Search Report of PCT/JP2013/074964 mailed Dec. 17, 2013.

*Primary Examiner* — Thomas L Dickey
(74) *Attorney, Agent, or Firm* — Studebaker & Brackett PC

(57) ABSTRACT

A semiconductor device includes a first MOS transistor and a second MOS transistor of a second conductivity type. The first MOS transistor includes a first main electrode connected to a first potential and a second main electrode connected to a second potential. The second MOS transistor includes a first main electrode connected to a control electrode of the first MOS transistor and a second main electrode connected to the second potential. The control electrodes of the first and second MOS transistors are connected in common. The first and second MOS transistors are formed on a common wide bandgap semiconductor substrate. In the first MOS transistor, a main current flows in a direction perpendicular to a main surface of the wide bandgap semiconductor substrate. In the second MOS transistor, a main current flows in a direction parallel to the main surface of the wide bandgap semiconductor substrate.

13 Claims, 15 Drawing Sheets

(51) Int. Cl.
*H01L 29/78* (2006.01)
*H01L 21/82* (2006.01)
*H01L 29/66* (2006.01)
*H01L 29/20* (2006.01)
*H01L 27/02* (2006.01)
*H01L 27/06* (2006.01)
*H01L 29/06* (2006.01)

(52) U.S. Cl.
CPC ...... *H01L 27/0605* (2013.01); *H01L 29/0615* (2013.01); *H01L 29/1608* (2013.01); *H01L 29/2003* (2013.01); *H01L 29/66068* (2013.01); *H01L 29/78* (2013.01); *H01L 29/7803* (2013.01)

(56) References Cited

FOREIGN PATENT DOCUMENTS

| | | |
|---|---|---|
| JP | 2002-208702 A | 7/2002 |
| JP | 2007-299862 A | 11/2007 |

* cited by examiner

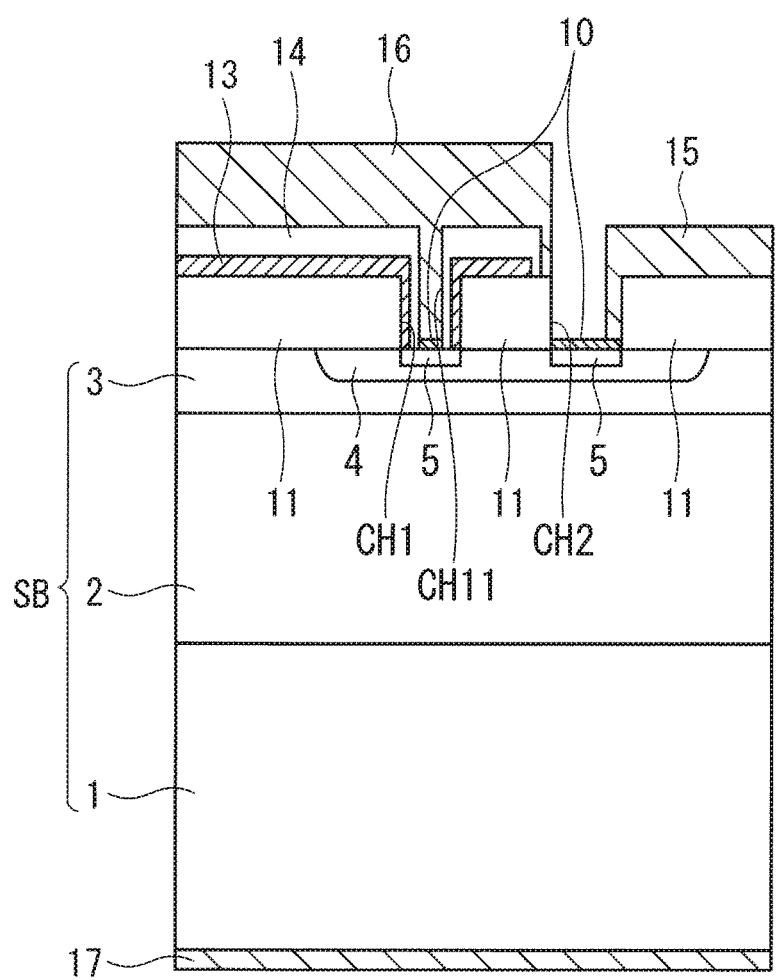
F I G. 2

F I G. 4
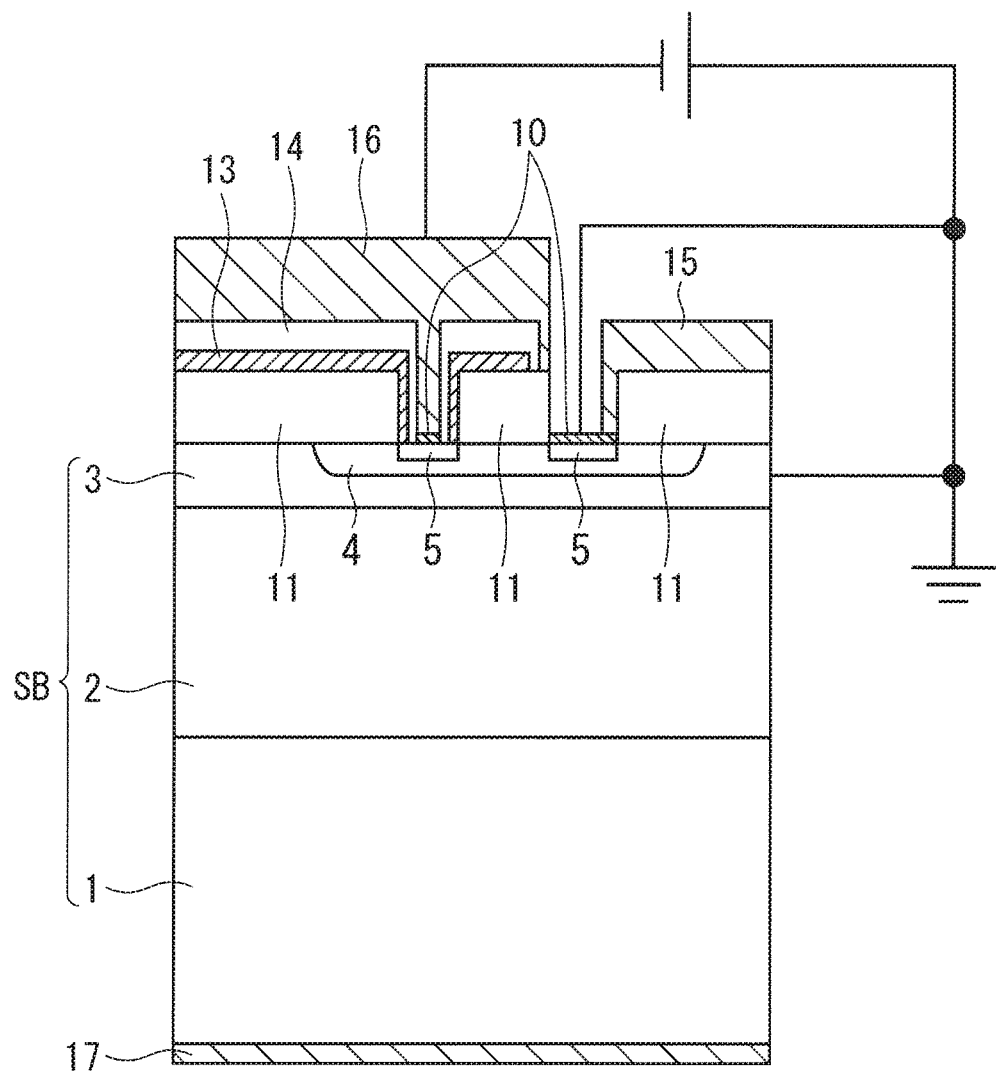

F I G. 1 1
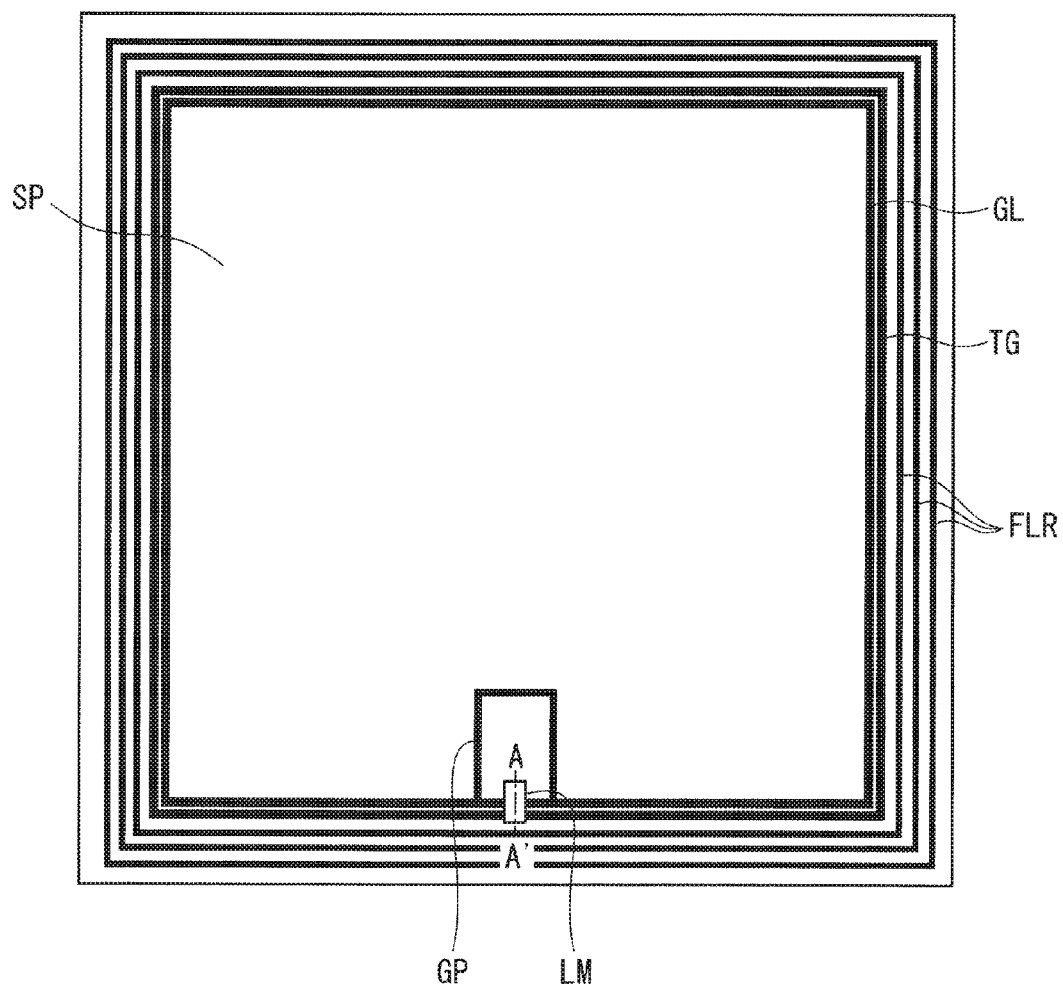

F I G. 1 3
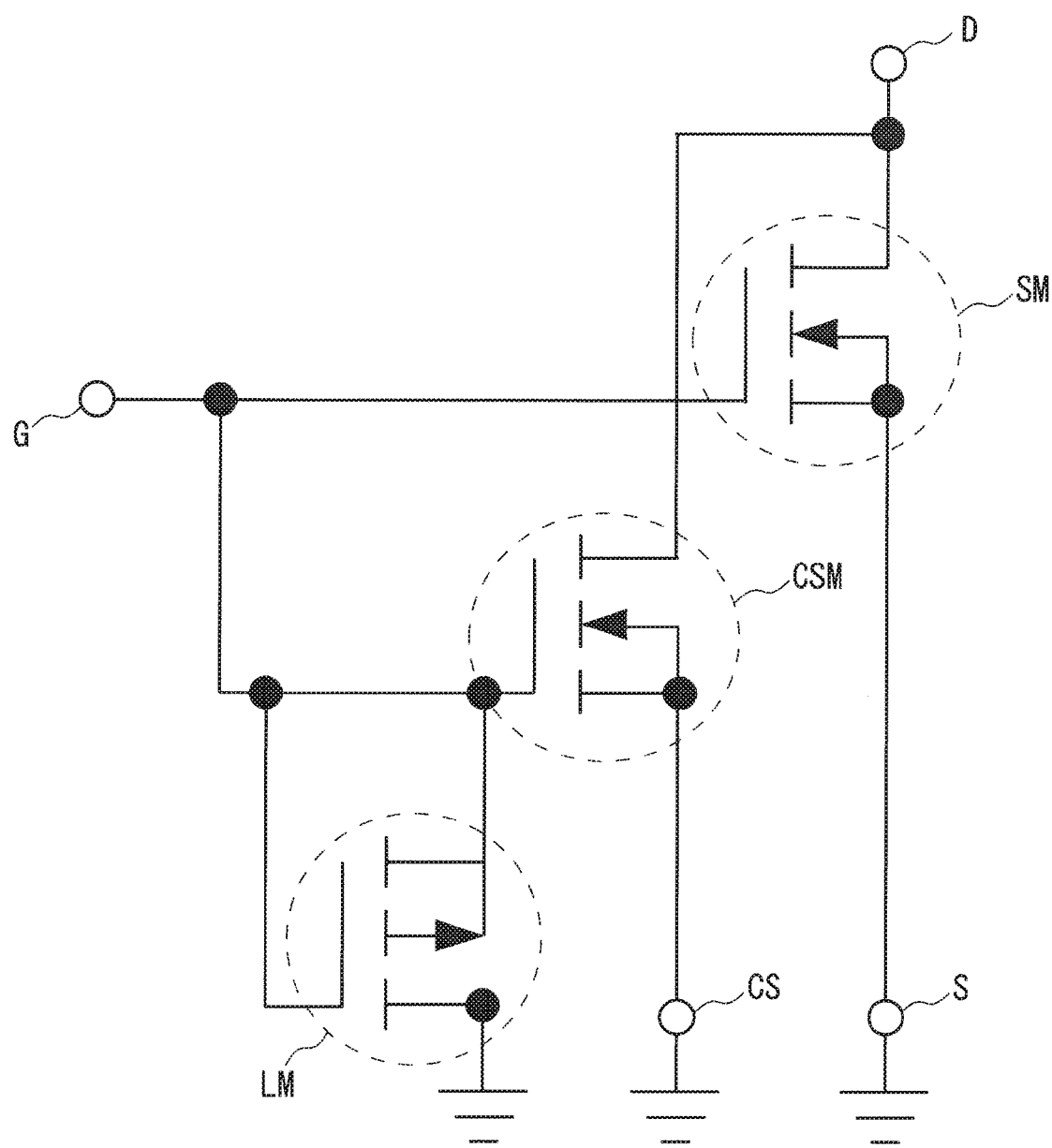

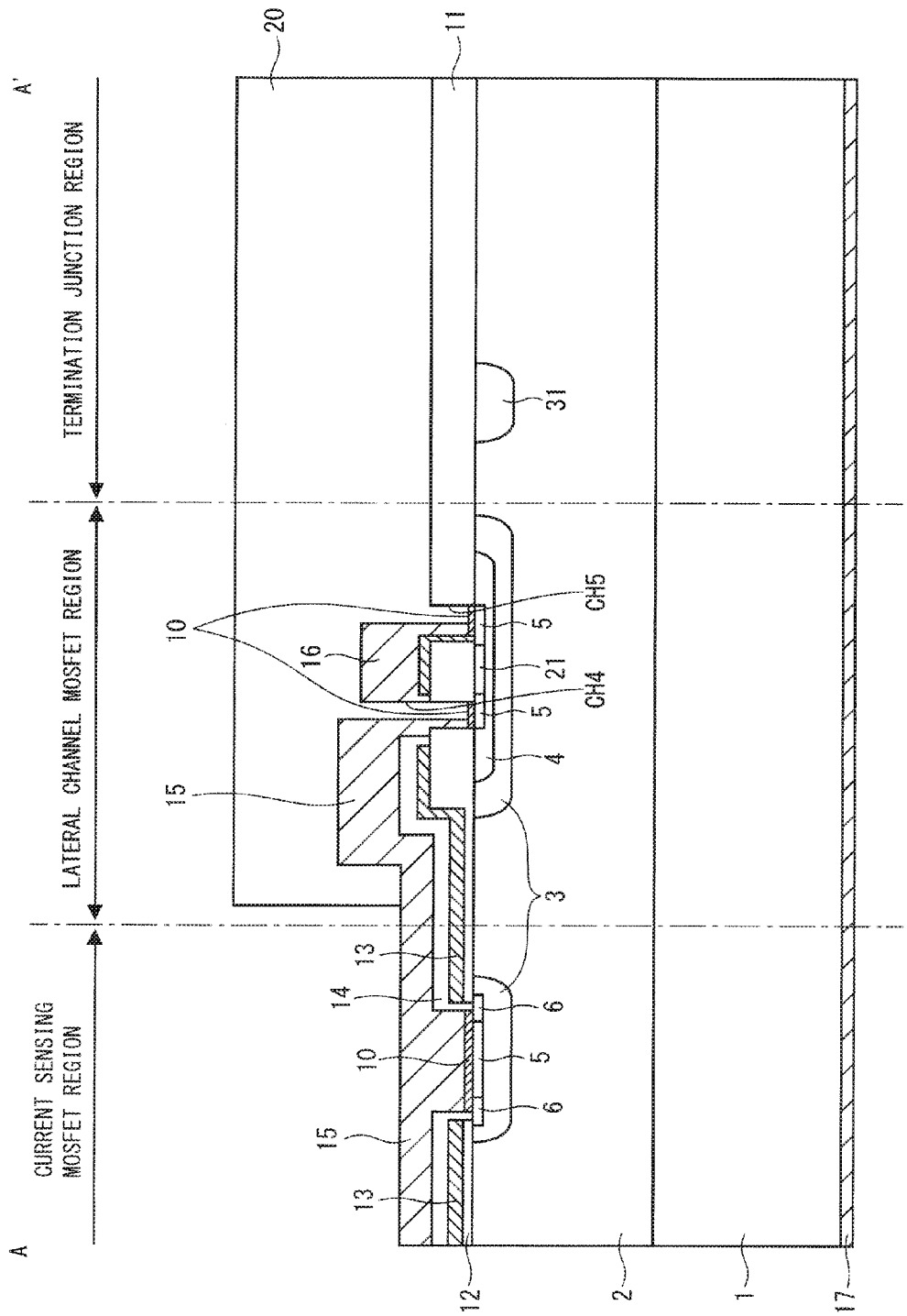

SEMICONDUCTOR DEVICE

TECHNICAL FIELD

The present invention relates to a semiconductor device and more particularly to a semiconductor device including a wide bandgap semiconductor.

BACKGROUND ART

The forward voltage drop (on voltage) between the drain and the source of the field effect transistor (SiC-MOSFET) with the metal-oxide-semiconductor junction structure (MOS) including a wide bandgap semiconductor, particularly silicon carbide (SiC), can be set to be smaller than that of the MOSFET (Si-MOSFET) including silicon carbide (Si). Thus, the number of unit cells and the size of chips of the SiC-MOSFET can be set to be smaller than those of the Si-MOSFET. For example, a 50% reduction in on resistance can result in a 50% reduction in the number of unit cells and a 50% reduction in the size of chips.

The area of the gate of the SiC-MOSFET is accordingly reduced, and thus, the capacitance component between the gate and the source is reduced, causing a reduction in the tolerance to electrostatic discharge damage (ESD) between the gate and the source.

In general, as a measure against electrostatic discharge damage, the Si-MOSFET has included a Zener diode connected between the gate and the source in some cases as disclosed in, for example, Patent Document 1. The Zener diode (poly-Zener diode) has been formed, as the p-n junction layer on the polysilicon (poly-Si) layer being the material of the gate electrode, through the source formation process (n-type diffusion layer formation process) and the P$^+$ diffusion process (p-type diffusion layer formation process) in the formation of unit cells.

PRIOR ART DOCUMENT

Patent Document

Patent Document 1: Japanese Patent Application aid-Open No. 2002-208702

SUMMARY OF INVENTION

Problems to be Solved by the Invention

The poly-Zener diodes included in wide bandgap semiconductor devices such as SiC-MOSFETs presumably produce some effects as a measure against electrostatic discharge damage. However, with respect to the temperature characteristics, the poly-Zener diodes are less controllable in the high temperature environment and are therefore unsuitable for the wide bandgap semiconductor devices that are expected to be used in the high temperature environment.

The present invention therefore has been made to solve the problem described above, and an object thereof is to provide a semiconductor device capable of preventing electrostatic discharge damage between the gate and the source of a wide bandgap semiconductor device such as a SiC-MOSFET.

Means to Solve the Problem

One aspect of a semiconductor device according to present invention includes a first MOS transistor of a first conductivity type and a second MOS transistor of a second conductivity type. The first MOS transistor includes a first main electrode connected to a first potential and a second main electrode connected to a second potential. The second MOS transistor includes a first main electrode connected to a control electrode of the first MOS transistor and a second main electrode connected to the second potential. The control electrode of the first MOS transistor and a control electrode of the second MOS transistor are connected in common. The first and second MOS transistors are formed on a common wide bandgap semiconductor substrate. In the first MOS transistor, a main current flows in a direction perpendicular to a main surface of the wide bandgap semiconductor substrate. In the second MOS transistor, a main current flows in a direction parallel to the main surface of the wide bandgap semiconductor substrate.

Effects of the Invention

In a case where a negative overvoltage is applied between the gate and the source of the wide bandgap semiconductor device such as the SiC-MOSFET, the semiconductor device mentioned above is capable of preventing overvoltage damage including the electrostatic discharge damage between the gate and the source.

BRIEF DESCRIPTION OF DRAWINGS

FIG. 2 A view illustrating a cross-sectional configuration of a lateral MOSFET (LM).

FIG. 4 A view describing an electric potential supplied to the lateral MOSFET (LM).

FIG. 9 A plan view schematically illustrating an upper surface configuration of the SiC-MOSFET (SM) according to a third embodiment of the present invention.

FIG. 11 A plan view schematically illustrating an upper surface configuration of the SiC-MOSFET (SM) according to a fourth embodiment of the present invention.

FIG. 13 A view illustrating a circuit configuration of the SiC-MOSFET according to a fifth embodiment of the present invention.

FIG. 15 A view illustrating a cross-sectional configuration of the SiC-MOSFET (SM) according to the fifth embodiment of the present inv

DESCRIPTION OF EMBODIMENTS

<Introduction>

The term "MOS" formerly used to refer the metal-oxide-semiconductor junction structure has been regarded as the acronym for "metal-oxide-semiconductor." For the electric field effect transistor (hereinafter simply referred to as "MOS transistor") having the MOS structure in particular, the materials of the gate insulating film and the gate electrode have been improved from the viewpoint of the integration and the improvement in manufacturing process in recent years.

For example, the recent MOS transistors include gate electrodes made of polycrystalline silicon, instead of gate electrodes made of metal, to allow the self-aligning formation of the source and the drain. In view of improving the electric characteristics gate insulating films are made of high-dielectric constant materials, which are not limited to oxides.

Thus, the term "MOS" does not necessarily refer to the metal-oxide-semiconductor lamination structure alone, which holds true in this specification. In view of the general technical knowledge, "MOS" being the acronym of the original words hereinafter also refer to the semiconductor-insulator-semiconductor lamination structure at large.

<First Embodiment>

Figure 1:
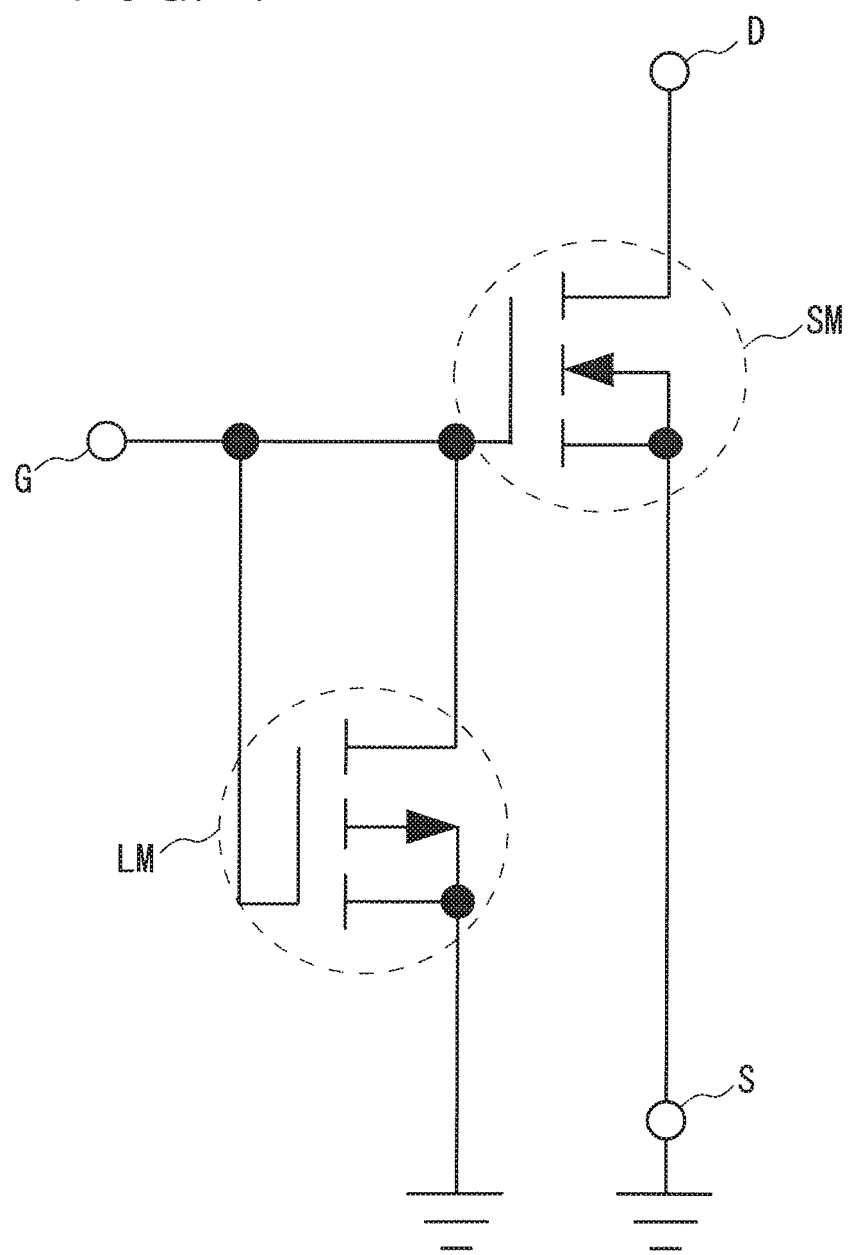
FIG. 1 A view illustrating a circuit configuration of an SiC-MOSFET according to a first embodiment of the present invention.

FIG. 1 is a view illustrating a circuit configuration of an SiC-MOSFET including a lateral MOSFET provided as a measure against electrostatic discharge damage.

As illustrated in FIG. 1, a lateral MOSFET LM of p-channel type is connected between a gate (G) and a source (S) of an SiC-MOSFET SM of n-channel type. The gate of the SiC-MOSFET SM and the gate of the lateral MOSFET LM are connected in common. The source of the SiC-MOSFET SM and the source of the lateral MOSFET LM are grounded.

FIG. 2 illustrates a cross-sectional configuration of the lateral MOSFET LM of p-channel type. As illustrated in FIG. 2, the lateral MOSFET LM includes an $n^+$ buffer layer 1 obtained by introducing n-type impurities into a silicon carbide substrate at a high concentration, an $n^-$ layer 2 formed on the $n^+$ buffer layer 1 and containing n-type impurities at a relatively low concentration, and a p base layer 3 formed in the upper layer portion of the $n^-$ layer 2 and containing p-type impurities.

An n base layer 4 containing n-type impurities is selectively formed in the surface of the p base layer 3. A plurality of $p^+$ layers 5 containing p-type impurities at a relatively high concentration are selectively formed in pairs in the surface of the n base layer 4. The $n^+$ buffer layer 1, the $n^-$ layer 2, the p base layer 3, the n base layer 4, and the $p^+$ layers 5 are included in the silicon carbide substrate and therefore collectively referred to as a substrate portion SB.

A field oxide film 11 is formed on the substrate portion SB. In the field oxide film 11, contact holes CH1 and CH2 are formed to penetrate the field oxide film 11 in the thickness direction and reach the surfaces of the $p^+$ layers 5.

A polysilicon film 13 is formed on the inner wall of the contact hole CH1 and on the field oxide film 11. An interlayer insulating film 14 is formed so as to cover the polysilicon film 13. A gate electrode 16 is formed on the interlayer insulating film 14. In the portion corresponding to the contact hole CH1, the gate electrode 16 fills a contact hole CH11 penetrating the interlayer insulating film 14 and reaching the surface of the $p^+$ layer 5. A silicide film 10 made of silicide such as NiSi is formed on the $p^+$ layer 5 underlying the contact hole CH11. The gate electrode 16 is connected with the silicide film 10.

The silicide film 10 made of silicide such as NiSi is formed on the $p^+$ layer 5 underlying the contact hole CH2. A source electrode 15 is formed to extend on the inner wall of the contact hole CH2 opposite to the contact hole CH1 and on the field oxide film 11. The source electrode 15 is connected with the edge portion of the silicide film 10. A drain electrode 17 is located on the main surface of the substrate portion SB on the $n^+$ buffer layer 1 side.

Figure 3:
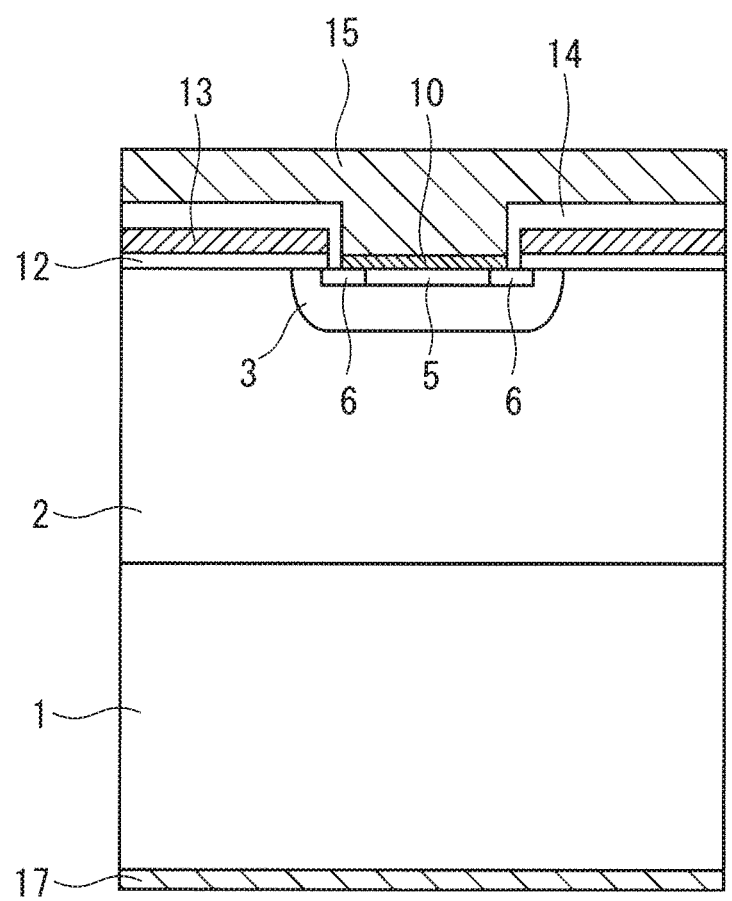

FIG. 3 illustrates a cross-sectional configuration of the SiC-MOSFET SM. The SiC-MOSFET SM shares the substrate portion SB with the lateral MOSFET LM. A plurality of $n^+$ source layers 6 containing n-type impurities at a relatively high concentration are selectively formed in pairs in the surface of the p base layer 3. The $p^+$ layer 5 containing p-type impurities at a relatively high concentration is formed between the pairwise $n^+$ source layers 6.

A gate oxide film 12 is formed on the substrate portion SB. The polysilicon film 13 functioning as the gate electrode is formed on the gate oxide film 12. The gate oxide film 12 and the polysilicon film 13 are provided so as to extend on the edge portions of the $n^+$ source layers 6, on the upper portion of the p base layer 3 outside the $n^+$ source layers 6, and on the $n^-$ layer 2 located further outward, but are not located on the $p^+$ layer 5. The silicide film 10 make of silicide such as NiSi is formed on the $p^+$ layer 5 and the $n^+$ source layers 6 surrounding the $p^+$ layer 5.

The interlayer insulating film 14 is formed so as to cover the gate insulating film 12 and the polysilicon film 13. The source electrode 15 is formed on the interlayer insulating film 14 and the silicide film 10 that is not covered with the interlayer insulating film 14.

With reference to FIG. 4, the following describes the electric potential supplied to the lateral MOSFET LM. As illustrated in FIG. 4, when a negative potential is supplied to the gate electrode 16 and the source electrode 15 is grounded, the n base layer 4 floats, which presents no operational problem as long as the breakdown voltage between the drain and the source is set to be higher than the threshold voltage (VGSth).

Figure 5:
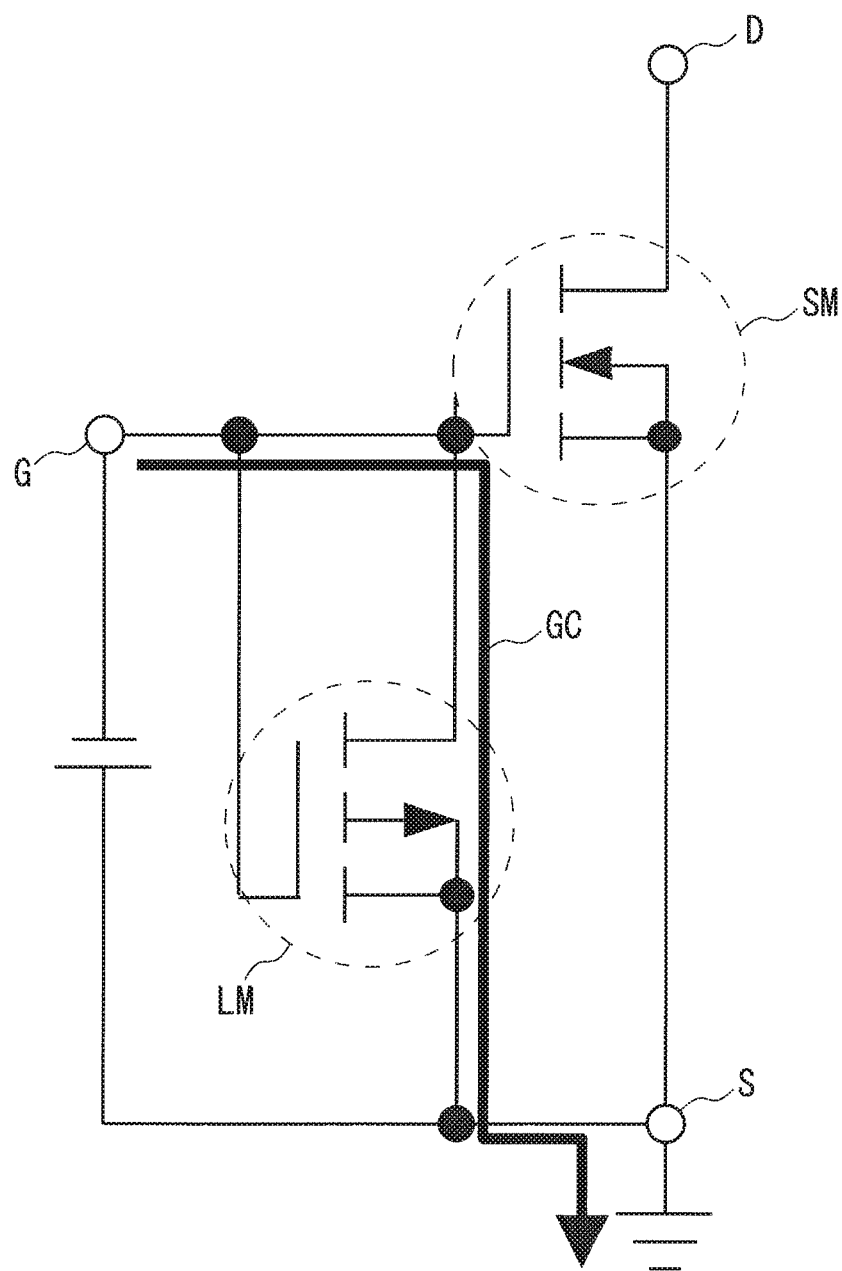
FIG. 5 A view illustrating a path over which a gate current flows for the case where a negative overvoltage is applied between a gate and a source of the SiC-MOSFET (SM).

FIG. 5 is a view illustrating a path over which a gate current flows in the circuit configuration illustrated in FIG. 1 for the case where a negative overvoltage is applied between the gate and the source of the SiC-MOSFET SM.

As illustrated in FIG. 5, when a negative overvoltage is applied between the gate and the source of the SiC-MOSFET SM, a gate current GC flows to the ground through the path between the source and the drain of the lateral MOSFET LM.

Figure 6:
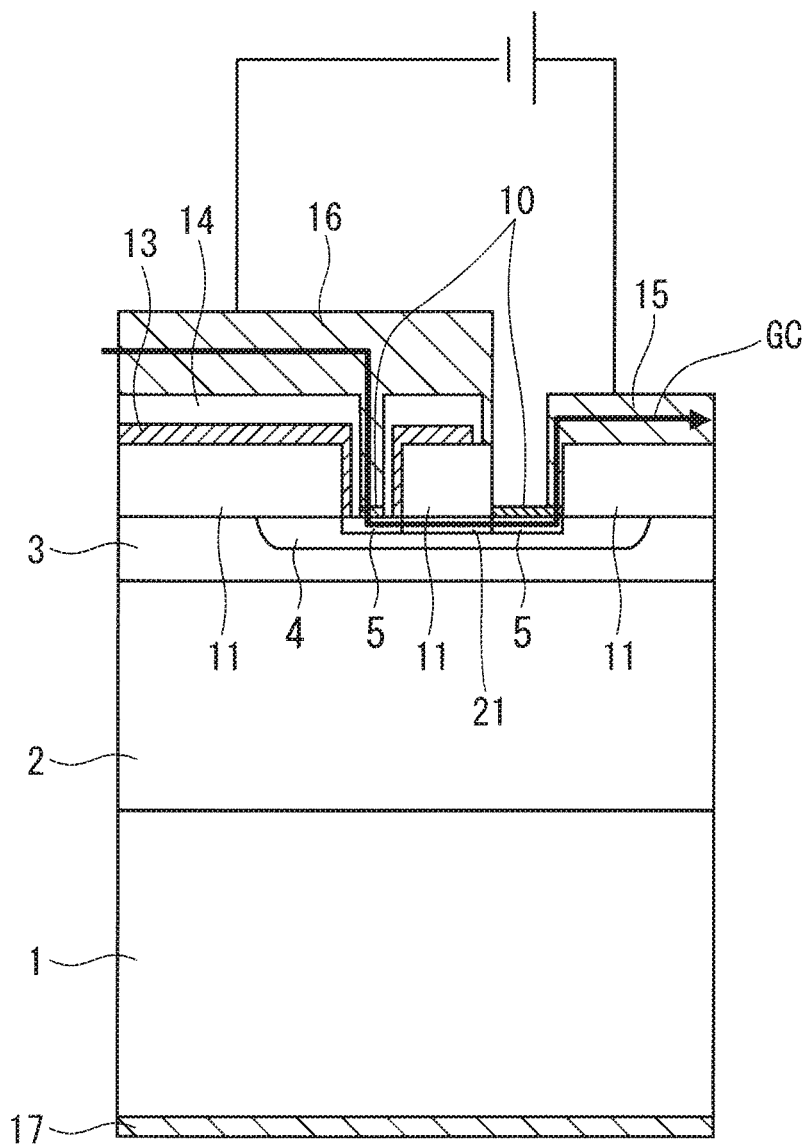
FIG. 6 A view illustrating the flow of gate current for the case where a negative overvoltage is applied between the gate and the source of the SiC-MOSFET.

FIG. 6 is a cross-sectional view illustrating the flow of the gate current GC for the case where a negative overvoltage is applied between the gate and the source of the SiC-MOSFET.

As illustrated in FIG. 6, when a negative overvoltage is applied between the gate and the source of the SiC-MOSFET, the same voltage is applied between the gate and the source of the lateral MOSFET LM included in the SiC-MOSFET, and accordingly, a p channel 21 is formed between the pairwise $p^+$ layers 5 to the lateral MOSFET LM. In this lateral MOSFET LM, the field oxide film 11 serves as the gate oxide film and the p channel 21 is formed below the gate electrode 16.

The p channel 21 is formed, so that the gate current GC generated due to the overvoltage between the gate and the source of the SiC-MOSFET SM flows to the ground through the path between the source and the drain of the lateral MOSFET LM. This eliminates or reduces the gate current flowing through the path between the gate and the source of the SiC-MOSFET SM, and accordingly, prevents the electrostatic discharge damage caused by the negative overvoltage between the gate and the source.

As described above, when a negative overvoltage is applied between the gate and the source of the SiC-MOSFET SM, the lateral MOSFET LM of p-channel type included in the SiC-MOSFET SM can prevent overvoltage damage such as the electrostatic discharge damage between the gate and the source.

<Setting of Threshold Voltage>

The VGSth between the gate and the source of the lateral MOSFET LM described above is set to −25 V or below, thereby preventing the lateral MOSFET LM from affecting the normal operation of the SiC-MOSFET SM.

The maximum rated voltage on the negative side between the gate and the source of the general SiC-MOSFET ranges from −5 to −20 V. Thus, the VGSth of the lateral MOSFET LM is set to −25 V or below (or equivalently, the threshold voltage of the lateral MOSFET LM on the negative side is set to be lower than the threshold voltage of the SiC-MOSFET SM on the negative side). Thus, in a case where the voltage between −5 and −20 V inclusive is applied as the voltage between the gate and the source, the lateral MOSFET LM does not operate, and accordingly, the normal operation of the SiC-MOSFET SM is unaffected. The lateral MOSFET LM functions as the overvoltage protection element that operates only in the application of a negative overvoltage equal to or less than −25V.

If the VGSth of the lateral MOSFET LM is set to −25 V or below, the forward voltage drop (on voltage) of the lateral MOSFET LM increases, and accordingly, the gate current generated due to the gate overvoltage is consumed within the lateral MOSFET LM.

This eliminates the need for providing, between the lateral MOSFET and the SiC-MOSFET, the resistance element for consumption of gate current.

<Second Embodiment>

According to the description given in a first embodiment with reference to FIG. 6, the gate current GC generated due to the overvoltage between the gate and the source of the SiC-MOSFET SM flows to the ground through the path between the source and the drain of the lateral MOSFET LM. In another configuration, the source electrode 15 of the lateral MOSFET LM may be connected to the ground (GND) wire in the termination junction region of the SiC-MOSFET SM.

Figure 7:
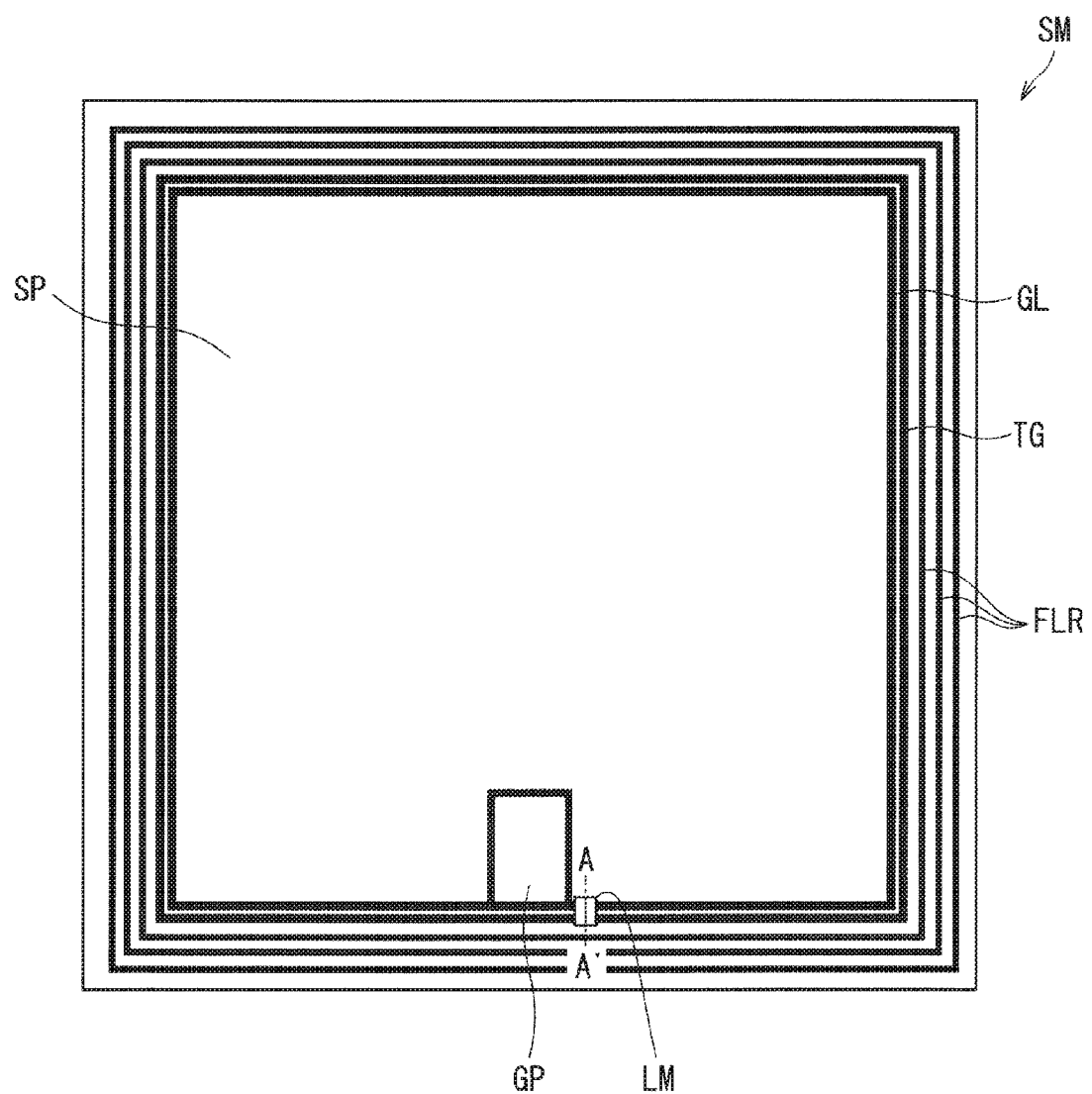
FIG. 7 A plan view schematically illustrating an upper surface configuration of the SiC-MOSFET (SM) according to a second embodiment of the present invention.

FIG. 7 is a plan view schematically illustrating the upper surface configuration of the SiC-MOSFET SM according to a second embodiment.

As illustrated in FIG. 7, the SiC-MOSFET SM includes a source pad SP having a quadrilateral outline in plan view and a gate wire GL surrounding the outside of the source pad SP.

The source pad SP has, in plan view, a quadrilateral shape with the midsection of one of the sides of the quadrilateral shape being recessed inwardly. A gate pad GP extended from the gate wire GL in the periphery is provided so as to fit in the inwardly recessed portion of the source pad SP. The gate wire GL is also located along the periphery of the gate pad GP.

The gate pad GP is the section to which a gate voltage is applied from the outside through the wire connected by wire bonding. The gate voltage applied to this section is applied, through the gate wire GL, to the gate electrodes of unit cells being the minimum unit structure of the SiC-MOSFET SM.

The source pad SP is located on the active region in which a plurality of unit cells are located. The source electrodes (not shown) of the individual unit cells are connected in parallel.

A GND wire TG in the termination junction region is provided so as to surround the gate wire GL. A plurality of field limiting rings FLR are concentrically located on the outer side of these wires.

In the SiC-MOSFET SM having the above-mentioned configuration, the lateral MOSFET LM is provided so as to bridge over the gate wire GL and the GND wire TG in the termination junction region in the vicinity of the gate pad GP.

Figure 8:
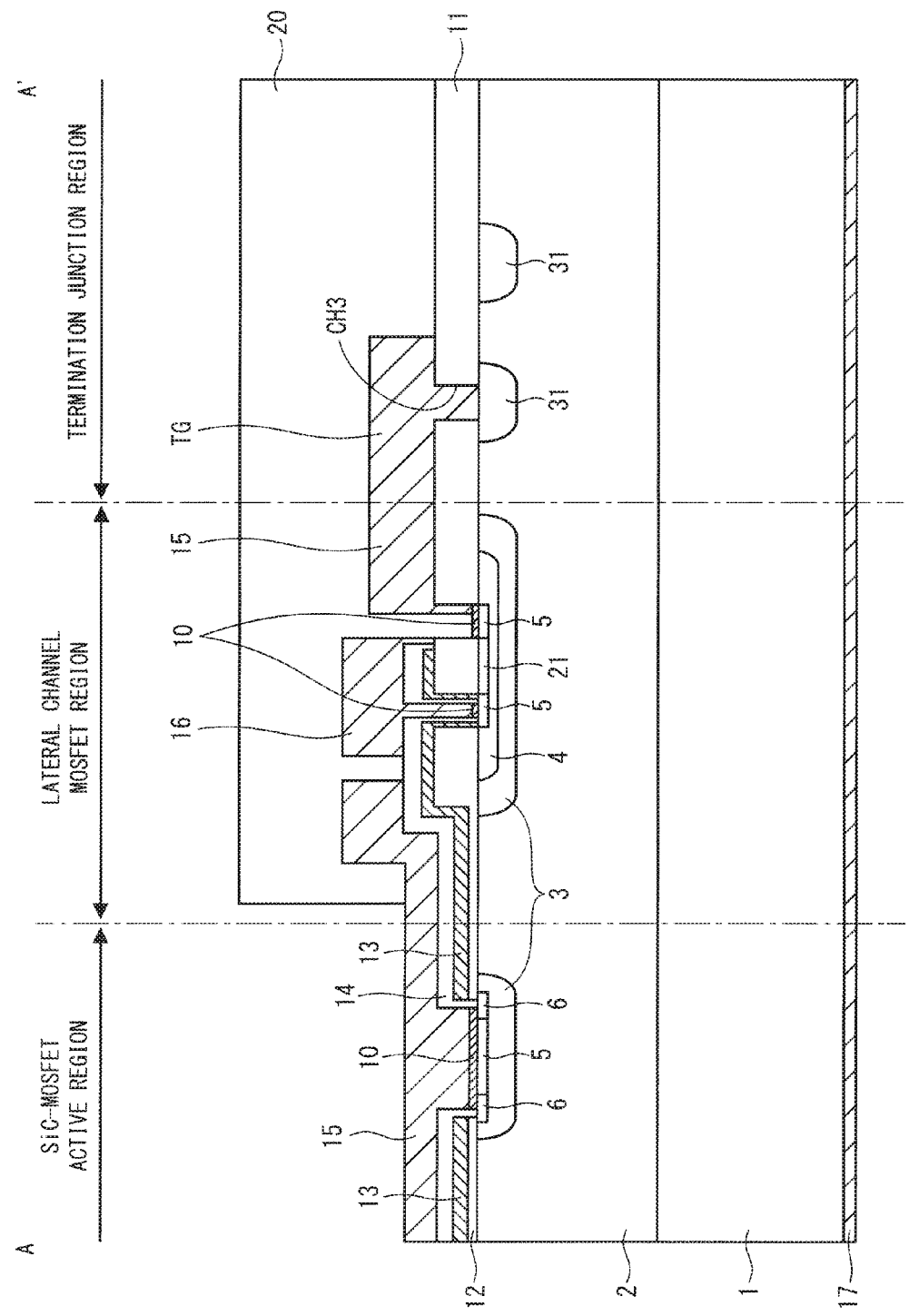
FIG. 8 A view illustrating a cross-sectional configuration of the SiC-MOSFET (SM) according to the second embodiment of the present invention.

FIG. 8 is a view illustrating the cross-sectional configuration taken along the line A-A' in FIG. 7. FIG. 8 illustrates the SiC-MOSFET active region, the lateral MOSFET region, and the termination junction region. The SiC-MOSFET having the same configuration as that of the SiC-MOSFET described with reference to FIG. 3 is located in the SiC-MOSFET active region. The lateral MOSFET having the same configuration as that of the lateral MOSFET described with reference to FIG. 2 is located in the lateral MOSFET region. The same components are denoted by the same reference signs and the description thereof is not repeated.

In the termination junction region, meanwhile, a plurality of p layers 31 that form the field limiting rings FLR and contain p-type impurities are located in the surface of the n⁻ layer 2 at intervals. The upper portions of the p layers 31 are covered with the field oxide film 11. One of the p layers 31 is connected with the GND wire TG in the termination junction region through a contact hole CH3 penetrating the field oxide film 11 in the thickness direction. The GND wire TG in the termination junction region is connected with the source electrode 15. The termination junction region and the lateral MOSFET region are covered with a termination junction protective film 20.

This configuration allows the gate current generated due to the overvoltage between the gate and the source of the SiC-MOSFET SM to flow into the GND wire TG in the termination junction region through the path between the source and the drain of the lateral MOSFET LM. Thus, the active operation (unit cell operation) of the SiC-MOSFET in the normal state is unaffected.

<Third Embodiment>

According to the description given in the first embodiment with reference to FIG. 6, the gate current GC generated due to the overvoltage between the gate and the source of the SiC-MOSFET SM flows to the ground through the path between the source and the drain of the lateral MOSFET LM. In another configuration, the source electrode 15 of the lateral MOSFET LM may be connected to the source electrode of the SiC-MOSFET SM.

Figure 9:
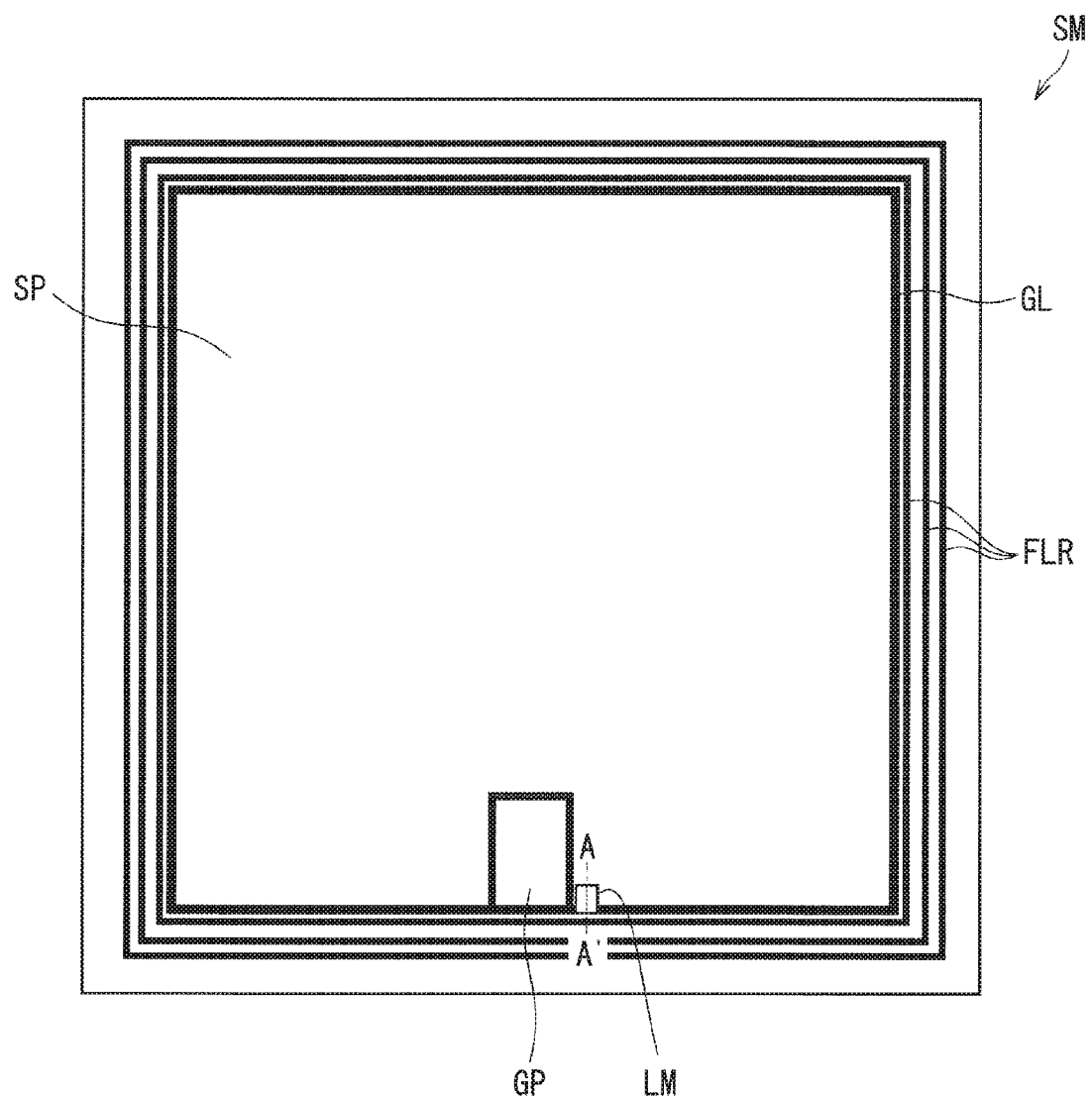
FIG. 9 A view illustrating a cross-sectional configuration of an SiC-MOSFET (SM).

FIG. 9 is a plan view schematically illustrating the upper surface configuration of the SiC-MOSFET SM according to a third embodiment. The components identical to those illustrated the plan view in FIG. 7 are denoted by the same reference signs and the description thereof is not repeated.

With reference to FIG. 9, the gate wire GL is provided so as to surround the outside of the source pad SP. The plurality of field limiting rings FLR are concentrically provided so as to surround the gate wire GL.

In the SiC-MOSFET SM having the above-mentioned configuration, the lateral MOSFET LM is provided so as to bridge over the gate wire GL in the vicinity of the gate pad GP.

Figure 10:
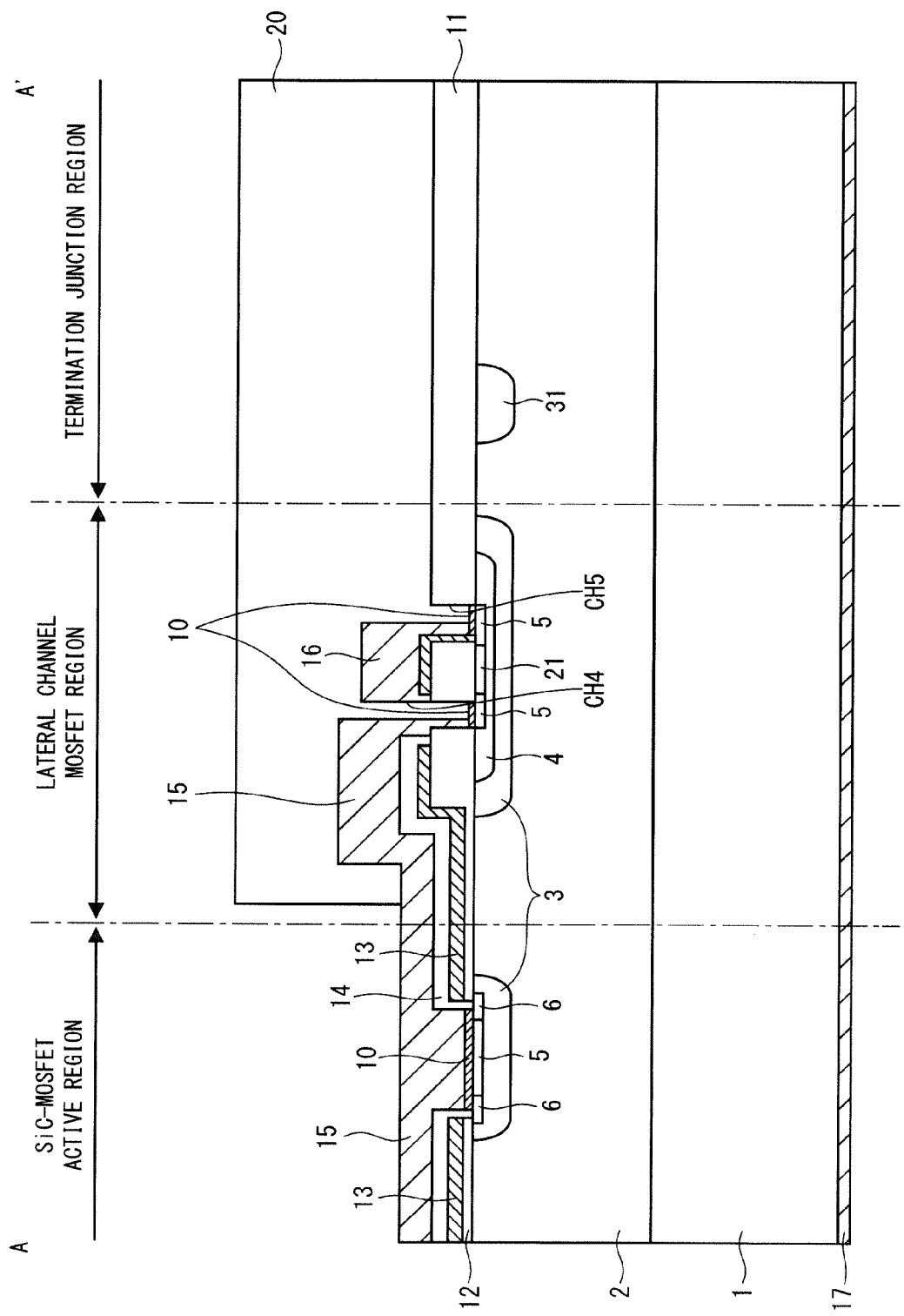
FIG. 10 A view illustrating a cross-sectional configuration of the SiC-MOSFET (SM) according to the third embodiment of the present invention.

FIG. 10 is a view illustrating the cross-sectional configuration taken along the line A-A' in FIG. 9. FIG. 10 illustrates the SiC-MOSFET active region, the lateral MOSFET region, and the termination junction region. The SiC-MOSFET having the same configuration as that of the SiC-MOSFET described with reference to FIG. 3 is located in the SiC-MOSFET active region. The same components are denoted by the same reference signs and the description thereof is not repeated.

For the lateral MOSFET LM located in the lateral MOSFET region, contact holes CH4 and CH5 are formed in the field oxide film 11 to penetrate the field oxide film 11 in the thickness direction and reach the surfaces of the $p^+$ layers 5. The inner wall of the contact hole CH4 close to the SiC-MOSFET active region side is covered with the source electrode 15, the inner wall being located opposite to the termination junction region. The source electrode 15 is connected with the silicide film 10 underlying the contact hole CH4.

The polysilicon film 13 is formed on the field oxide film 11. The polysilicon film 13 extends on the gate oxide film 12 located in the SiC-MOSFET active region. The field oxide film 11, the polysilicon film 13, and the gate oxide film 12 are covered with the interlayer insulating film 14.

The source electrode 15 of the lateral MOSFET LM is formed on the interlayer insulating film 14 as well and is connected with the source electrode 15 of the SiC-MOSFET SM.

Meanwhile, the inner wall of the contact hole CH5 close to the termination junction region side is covered with the polysilicon film 13, the inner wall being located opposite to the SiC-MOSFET active region. The polysilicon film 13 is connected with the $p^+$ layer 5 underlying the contact hole CH5.

The polysilicon film 13 extends on the field oxide film 11. The gate electrode 16 is formed so as to cover the field oxide film 11 and the polysilicon film 13 in the contact hole CH5.

This configuration allows the gate current generated due the overvoltage between the gate and the source of the SiC-MOSFET SM to flow from the gate electrode 16 to the source electrode 15 of the SiC-MOSFET SM through the path between the source and the drain of the lateral MOSFET LM.

Unlike the second embodiment, this eliminates the need for the GND wire TG in the termination junction region of the SiC-MOSFET, thus regulating an increase in the invalid region of the SiC-MOSFET chip.

This allows for the incorporation of the lateral MOSFET LM with no additional chip area, thus regulating an increase in chip cost.

<Fourth Embodiment>

Although the lateral MOSFET LM is located in the vicinity of the gate pad GP according to the description in the second and third embodiments, the lateral MOSFET LM may be formed in another position. For example, the lateral MOSFET LM may be located within the region of the gate pad GP.

FIG. 11 is a plan view schematically illustrating an upper surface configuration of the SiC-MOSFET SM according to a fourth embodiment. The components identical to those illustrated in the plan view in FIG. 7 are denoted by the same reference signs and the description thereof is not repeated.

The GND wire TG in the termination junction region is provided so as to surround the gate wire GL. The plurality of field limiting rings FLR are concentrically located on the outer side of these wires.

In the SiC MOSFET SM having the above-mentioned configuration, the lateral MOSFET LM is provided so as to bridge over the gate wire GL of the gate pad GP in the vicinity of the GND wire TG in the termination junction region and the GND wire TG in the termination junction region.

Figure 12:
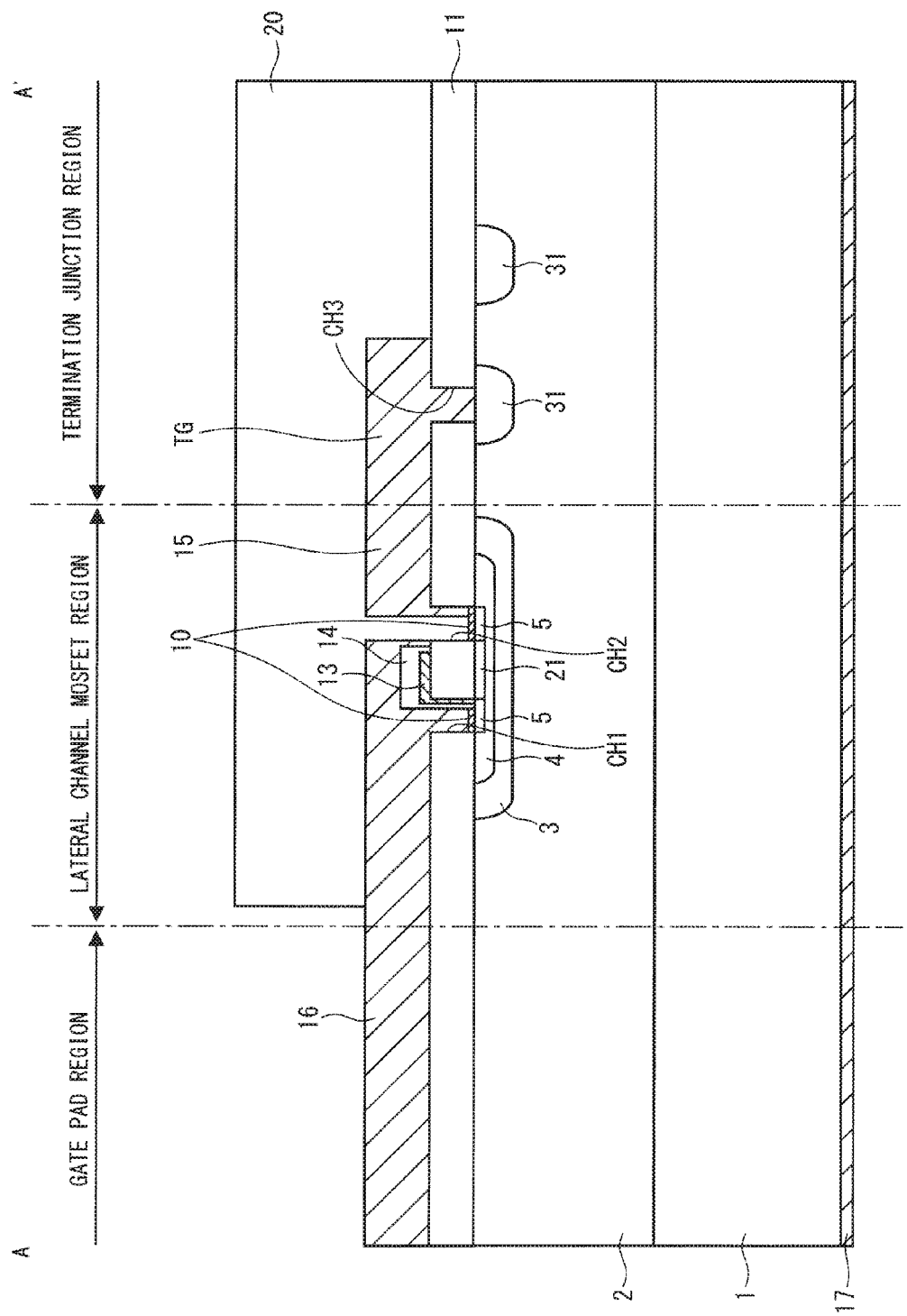
FIG. 12 A view illustrating a cross-sectional configuration of the SiC-MOSFET (SM) according to the fourth embodiment of the present invention.

FIG. 12 is a view illustrating the cross-sectional configuration taken along the line A-A' in FIG. 11. FIG. 12 illustrates the gate pad region, the lateral MOSFET region, and the termination junction region.

In the gate pad region, the $n^-$ layer 2 is covered with the field oxide film 11 and the field oxide film 11 is covered with the gate electrode 16.

For the lateral MOSFET LM located in the lateral MOSFET region, the field oxide film 11 has the contact holes CH1 and CH2 formed therein, the contact holes penetrating the field oxide film 11 in the thickness direction and reaching the surface of the $p^+$ layer 5. The polysilicon film 13 is formed on the field oxide film 11 and the inner wall of the contact hole CH1 close to the gate pad region side, the inner wall being located opposite to the gate pad region. The interlayer insulating film 14 is formed so as to cover the polysilicon film 13. The gate electrode 16 is formed on the interlayer insulating film 14. The gate electrode 16 fills the remaining portion of the contact hole CH1. The silicide film 10 made of silicide such as NiSi is formed on the $p^+$ layer 5 underlying the contact hole CH1. The gate electrode 16 is connected with the silicide film 10.

The silicide film 10 made of silicide such as NiSi is formed on the $p^+$ layer 5 underlying the contact hole CH2. The source electrode 15 is formed on the inner wall of the contact hole CH2 close to the termination junction region side and on the field oxide film 11. The source electrode 15 is connected with the edge portion of the silicide film 10.

In the termination junction region, meanwhile, the plurality of p layers 31 that form the field limiting rings FLR and contain p-type impurities are located in the surface of the $n^-$ layer 2 at intervals. The upper portions of the p layers 31 are covered with the field oxide film 11. One of the p layers 31 is connected with the GND wire TG in the termination junction region through the contact hole CH3 penetrating the field oxide film 11 in the thickness direction. The GND wire TG in the termination junction region is connected with the source electrode 15.

This configuration allows the gate current GC generated due to the overvoltage between the gate and the source of the SiC-MOSFET SM to flow into the GND wire TG in the termination junction region through the path between the source and the drain of the lateral MOSFET LM. Thus, the active operation (unit cell operation) of the SiC-MOSFET in the normal state is unaffected.

The lateral MOSFET LM is formed within the gate pad GP, thus regulating an increase in the invalid region of the SiC-MOSFET chip.

This allows for the incorporation of the lateral MOSFET LM with no additional chip area, thus regulating an increase in chip cost.

<Fifth Embodiment>

According to the description given in the first to fourth embodiments, with reference to FIG. 1, the lateral MOSFET LM is connected with the path between the source and the gate of the SiC-MOSFET SM. Alternatively, for the SiC-MOSFET including a current sensing element, the lateral MOSFET LM may be connected to the path between the gate and the source of the MOSFET serving as the current sensing element.

The current sensing elements are mainly included in the IGBT chips and the MOSFET chips for use in, for example, the intelligent power modules (IPMs) in order to sense an overcurrent in the chips and protect these chips from the overcurrent.

In general, the MOSFET serving as the current sensing element includes an active region through which a current corresponding to about a ten-thousandth of a current flowing through the active region of the IGBT chip or the MOSFET chip can be caused to flow. The area of the active region in the current sensing element is small, and accordingly, the capacitance between the gate and the source is small, resulting in the poor tolerance to electrostatic discharge damage between the gate and the source.

Thus, the lateral MOSFET LM is connected between the gate and the source of the MOSFET serving as the current sensing element. This mainly prevents electrostatic discharge damage associated with the negative overvoltage applied between the gate and the source of the current sensing element.

FIG. 13 illustrates the circuit configuration of the SiC-MOSFET including the lateral MOSFET provided as a measure against electrostatic discharge damage in the current sensing element.

As illustrated in FIG. 13, a current sensing MOSFET CSM of n-channel type is connected in parallel with the SiC-MOSFET SM of n-channel type. The lateral MOSFET LM of p-channel type is connected between the gate and the source of the SiC-MOSFET CSM. The gate of the SiC-MOSFET SM, the gate of the lateral MOSFET LM, and the gate of the current sensing MOSFET CSM are connected in common. The source of the SiC-MOSFET SM, the source of the lateral MOSFET LM, and a source CS of the current sensing MOSFET CSM are grounded.

Figure 14:
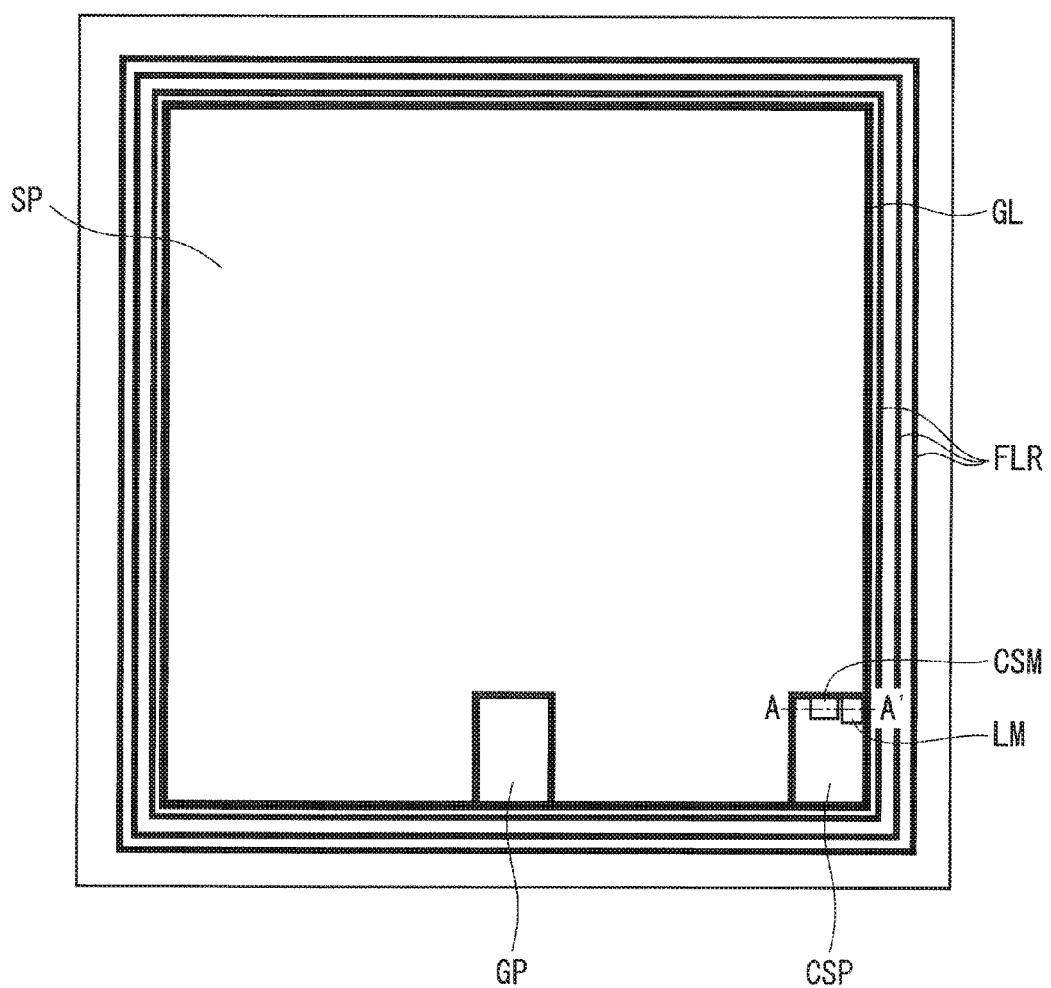
FIG. 14 A plan view schematically illustrating an upper surface configuration of the SiC-MOSFET (SM) according to the fifth embodiment of the present invention.

FIG. 14 is a plan view schematically illustrating an upper surface configuration the SiC-MOSFET SM according to a fifth embodiment. The components identical to those illustrated in the plan view in FIG. 7 are denoted by the same reference signs and the description thereof is not repeated.

With reference to FIG. 14, the gate wire GL is provided so as to surround the outside of the source pad SP and the plurality of field limiting rings FLR are concentrically provided so as to surround the gate wire GL. One of the corners of the source pad SP is recessed inwardly. A current sensing pad CSP having a quadrilateral shape is provided so as to fit in the inwardly recessed portion of the source pad SP. The current sensing pad CSP is surrounded by the gate wire GL.

The current sensing pad CSP is the portion in which a sense current is let out to the outside through a wire connected by wire bonding and is electrically connected with the current sensing MOSFET CSM.

For the SiC-MOSFET SM having the above-mentioned configuration, the lateral MOSFET LM is located adjacent to the current sensing MOSFET CSM in the current sensing pad CSP.

FIG. 15 is a view illustrating the cross-sectional configuration taken along the line A-A' in FIG. 14. FIG. 15 illustrates the current sensing MOSFET region, the lateral MOSFET region, and the termination junction region.

The SiC-MOSFET having the same configuration as that of the SiC-MOSFET described with reference to FIG. 3 is located in the current sensing MOSFET region. The lateral MOSFET LM having the same configuration as that of the lateral MOSFET described with reference to FIG. 10 is located in the lateral MOSFET region. The termination junction region has the same configuration as that of the termination junction region described with reference to FIG. 10. In these regions, the same components are denoted by the same reference signs and the description thereof is not repeated.

This configuration allows the gate current generated due to the overvoltage between the gate and the source of the current sensing MOSFET CSM to flow into the source electrode 15 of the current sensing MOSFET CSM through the path between the source and the drain of the lateral MOSFET LM, to thereby eliminate or reduce the gate current flowing through the path between the gate and the source of the current sensing MOSFET CSM and accordingly prevent the electrostatic discharge damage caused by the negative overvoltage between the gate and the source.

The lateral MOSFET LM is formed within the current sensing pad CSP, thus regulating an increase in the invalid region of the SiC-MOSFET chip.

This allows for the incorporation of the lateral MOSFET LM with no additional chip area, thus regulating an increase in chip cost.

<Setting of Threshold Voltage>

For the lateral MOSFET LM described above, the VGSth between the gate and the source is set to −25 V or below. This prevents the lateral MOSFET LM from affecting the operation of the current sensing MOSFET CSM. The reason for this is as described for the case where the lateral MOSFET LM is connected between the gate and the source of the SiC-MOSFET.

<Gate Oxide Film of Lateral MOSFET>

The field oxide film 11 serves as the gate oxide film for the case where the lateral MOSFET LM is connected between the gate and the source of the SiC-MOSFET and for the case where the lateral MOSFET LM is connected between the gate and the source of the current sensing MOSFET CSM. The field oxide film 11 is formed concurrently with the formation of the field oxide film 11 in the termination junction region shown in, for example, FIG. 8 in the same process.

In general, the field oxide film formed mainly in the termination junction region of the SiC-MOSFET has a thickness greater than that of the gate oxide film included in the active region (unit cells). Thus, the VGSth of the lateral MOSFET LM is set to be higher than the VGSth of the SiC-MOSFET through the use of this field oxide film as the gate oxide film of the lateral MOSFET LM with no additional process.

<Modifications>

In the first to fifth embodiments, the description has been given on the SiC-MOSFET of n-channel type, the current sensing MOSFET of n-channel type, and the lateral MOSFET of p-channel type, which may be replaced with the SiC-MOSFET of p-channel type, the current sensing MOSFET of p-channel type, and the lateral MOSFET of n-channel type.

The wide bandgap semiconductor is not limited to SiC. The present invention is applicable to the semiconductor device including a wide bandgap semiconductor such as GaN, thus producing the same effects.

In the present invention, the above embodiments can be arbitrarily combined, or each embodiment can be appropriately varied or omitted within the scope of the invention.

The invention claimed is:

1. A semiconductor device comprising:
a first MOS transistor of a first conductivity type including a first main electrode connected to a first potential and a second main electrode connected to a second potential; and
a second MOS transistor of a second conductivity type including a first main electrode connected to a control electrode of said first MOS transistor and a second main electrode connected to said second potential, wherein
said control electrode of said first MOS transistor and a control electrode of said second MOS transistor are connected in common,
said first and second MOS transistors are formed on a common wide bandgap semiconductor substrate,
in said first MOS transistor, a main current flows in a direction perpendicular to a main surface of said wide bandgap semiconductor substrate, and
in said second MOS transistor, a main current flows in a direction parallel to the main surface of said wide bandgap semiconductor substrate.

2. The semiconductor device according to claim 1, wherein
said first conductivity type is an n-channel type,
said second conductivity type is a p-channel type, and
said second MOS transistor has a threshold voltage on a negative side that is set to be lower than a threshold voltage of said first MOS transistor on the negative side.

3. The semiconductor device according to claim 1, wherein
said wide bandgap semiconductor substrate includes:
a unit cell region that includes a plurality of said first MOS transistors as unit cells and has a quadrilateral shape in plan view; and
a termination junction region that surrounds said unit cell region,
said termination junction region includes a ground wire that surrounds said unit cell region in a close proximity to said unit cell region, and
said second main electrode of said second MOS transistor is connected to said ground wire.

4. The semiconductor device according to claim 1, wherein said second main electrode of said second MOS transistor is connected to said second potential through said second main electrode of said first MOS transistor.

5. The semiconductor device according to claim 1, wherein
said wide bandgap semiconductor substrate includes:
a unit cell region that includes a plurality of said first MOS transistors as unit cells and has a quadrilateral shape in plan view; and
a termination junction region that surrounds said unit cell region,
said unit cell region has an inwardly recessed portion and includes a pad region located in the recessed portion and provided for wire bonding,
said pad region is electrically connected with said control electrode of said first MOS transistor, and
said second MOS transistor is formed in said pad region.

6. The semiconductor device according to claim 5, wherein
said termination junction region includes a ground wire that surrounds said unit cell region in a close proximity to said unit cell region, and
said second main electrode of said second MOS transistor is connected to said ground wire.

7. The semiconductor device according to claim 1, wherein said second MOS transistor includes a gate oxide film having a thickness identical to a thickness of a field oxide film of said first MOS transistor.

8. The semiconductor device according to claim 1, wherein said wide bandgap semiconductor substrate includes SiC or GaN as a wide bandgap semiconductor.

9. A semiconductor device comprising:
a first MOS transistor of a first conductivity type including a first main electrode connected to a first potential and a second main electrode connected to a second potential;
a current sensing MOS transistor of the first conductivity type including a first main electrode connected to said first potential and a second main electrode connected to said second potential; and
a second MOS transistor of a second conductivity type including a first main electrode connected to a control electrode of said current sensing MOS transistor and a second main electrode connected to said second potential, wherein
said control electrode of said current sensing MOS transistor and a control electrode of said second MOS transistor are connected in common,
said first and second MOS transistors and said current sensing MOS transistor are formed on a common wide bandgap semiconductor substrate,
in said first MOS transistor and said current sensing MOS transistor, a main current flows in a direction perpendicular to a main surface of said wide bandgap semiconductor substrate, and
in said second MOS transistor, a main current flows in a direction parallel to the main surface of said wide bandgap semiconductor substrate.

10. The semiconductor device according to claim 9, wherein
said wide bandgap semiconductor substrate includes:
a unit cell region that includes a plurality of said first MOS transistors as unit cells and has a quadrilateral shape in plan view; and
a termination junction region that surrounds said unit cell region,
said unit cell region has an inwardly recessed portion and includes a pad region located in the recessed portion and provided for wire bonding,
said pad region is electrically connected with said second main electrode of said current sensing MOS transistor, and
said second MOS transistor is formed in said pad region.

11. The semiconductor device according to claim 9, wherein
said first conductivity type is an n-channel type,
said second conductivity type is a p-channel type, and
said second MOS transistor has a threshold voltage on a negative side that is set to be lower than a threshold voltage of said current sensing MOS transistor on the negative side.

12. The semiconductor device according to claim 9, wherein said second MOS transistor includes a gate oxide film having a thickness identical to a thickness of a field oxide film of said first MOS transistor.

13. The semiconductor device according to claim 9, wherein said wide bandgap semiconductor substrate includes SiC or GaN as a wide bandgap semiconductor.

* * * * *